United States Patent
Cho et al.

(10) Patent No.: US 8,441,062 B2
(45) Date of Patent: May 14, 2013

(54) NONVOLATILE MEMORY DEVICES HAVING MEMORY CELL TRANSISTORS THEREIN WITH LOWER BANDGAP SOURCE/DRAIN REGIONS

(75) Inventors: Byung-kyu Cho, Seoul (KR);
Kwang-soo Seol, Yongin-si (KR);
Sung-hoi Hur, Seoul (KR); Jung-dal Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 189 days.

(21) Appl. No.: 12/974,542

(22) Filed: Dec. 21, 2010

(65) Prior Publication Data

US 2011/0233610 A1 Sep. 29, 2011

(30) Foreign Application Priority Data

Mar. 23, 2010 (KR) ........................ 10-2010-0025878

(51) Int. Cl.
*H01L 29/772* (2006.01)
(52) U.S. Cl.
USPC .......................................................... 257/324
(58) Field of Classification Search .................. 257/192, 257/324, 325
See application file for complete search history.

(56) References Cited

U.S. PATENT DOCUMENTS

| | | | |
|---|---|---|---|
| 6,313,486 B1 | 11/2001 | Kencke et al. | |
| 6,406,973 B1 * | 6/2002 | Lee | 438/416 |
| 2006/0043482 A1 * | 3/2006 | Burnett et al. | 257/344 |
| 2006/0214220 A1 * | 9/2006 | Forbes | 257/324 |
| 2008/0135903 A1 | 6/2008 | Hu | |
| 2009/0242958 A1 * | 10/2009 | Kikuchi et al. | 257/319 |

FOREIGN PATENT DOCUMENTS

| | | |
|---|---|---|
| JP | 2003-188288 | 7/2003 |
| KR | 10-0458595 | 11/2004 |

* cited by examiner

*Primary Examiner* — Thomas L Dickey
(74) *Attorney, Agent, or Firm* — Myers Bigel Sibley & Sajovec, P.A.

(57) ABSTRACT

Nonvolatile memory devices include a plurality of nonvolatile memory cell transistors having respective channel regions within a semiconductor layer formed of a first semiconductor material and respective source/drain regions formed of a second semiconductor material, which has a smaller bandgap relative to the first semiconductor material. The source/drain regions can form non-rectifying junctions with the channel regions. The source/drain regions may include germanium (e.g., Ge or SiGe regions), the semiconductor layer may be a P-type silicon layer and the source/drain regions of the plurality of nonvolatile memory cell transistors may be P-type germanium or P-type silicon germanium.

6 Claims, 14 Drawing Sheets

NONVOLATILE MEMORY DEVICES HAVING MEMORY CELL TRANSISTORS THEREIN WITH LOWER BANDGAP SOURCE/DRAIN REGIONS

REFERENCE TO PRIORITY APPLICATION

This application claims the benefit of Korean Patent Application No. 10-2010-0025878, filed Mar. 23, 2010, the contents of which are hereby incorporated herein in its entirety.

FIELD

This invention relates to memory devices and, more particularly, to nonvolatile memory devices.

BACKGROUND

Even when the volume of nonvolatile memory semiconductor devices decreases, high capacity data is still required to be processed in the nonvolatile memory semiconductor devices. Accordingly, integration of the nonvolatile memory semiconductor devices needs to be increased and a design rule for elements of the memory semiconductor devices is decreased. In particular, a gate length, which is a standard of the design rule, is decreasing in semiconductor devices that require a large number of transistors.

SUMMARY

Nonvolatile memory devices according to embodiments of the invention include a plurality of nonvolatile memory cell transistors having respective channel regions within a semiconductor layer formed of a first semiconductor material and respective source/drain regions formed of a second semiconductor material, which has a smaller bandgap relative to the first semiconductor material. According to some of these embodiments of the invention, the source/drain regions can form non-rectifying junctions with the channel regions. According to additional embodiments of the invention, the source/drain regions include germanium (e.g., Ge or SiGe regions). In particular, the semiconductor layer may be a P-type silicon layer and the source/drain regions of the plurality of nonvolatile memory cell transistors may be P-type germanium or P-type silicon germanium.

According to still further embodiments of the invention, a string selection transistor is provided, which has a respective channel region within the semiconductor layer. The string selection transistor may include source/drain regions of N-type silicon. Moreover, at least one of the plurality of nonvolatile memory cell transistors may include a first germanium (or silicon germanium) source/drain region and a second silicon source/drain region. For example, the first germanium (or silicon germanium) source/drain region can be P-type and the second silicon source/drain region can be N-type.

According to still further embodiments of the invention, a nonvolatile memory device includes a substrate having a buried silicon germanium layer therein and a silicon layer on the buried silicon germanium layer. A plurality of nonvolatile memory cell transistors are provided, which have respective channel regions within the silicon layer and respective source/drain regions within the buried silicon germanium layer. This plurality of nonvolatile memory cell transistors may be arranged as a NAND-type string of nonvolatile memory cell transistors. In addition, at least one of the plurality of nonvolatile memory cell transistors may have a first source/drain region within the buried silicon germanium layer and a second source/drain region within the silicon layer. The plurality of nonvolatile memory cell transistors may include charge storage regions on the silicon layer, with the silicon layer extending between the charge storage regions and the buried silicon germanium layer.

BRIEF DESCRIPTION OF THE DRAWINGS

Exemplary embodiments of the inventive concept will be more clearly understood from the following detailed description taken in conjunction with the accompanying drawings in which:

FIGS. 5A through 7 are cross-sectional diagrams of non-volatile memory cell strings according to other embodiments of the inventive concept;

DETAILED DESCRIPTION OF THE EMBODIMENTS

Hereinafter, one or more embodiments of the inventive concept will be described more fully with reference to the accompanying drawings. The inventive concept may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, like reference numerals denote like elements. Also, various elements and regions are schematically illustrated in the drawings. Thus, the inventive concept is not limited to sizes and intervals illustrated in the drawings. In the description, when it is described that a layer is disposed on another layer or a semiconductor layer, the layer may be directly disposed on the other layer or the semiconductor layer, or a third layer may be interposed therebetween.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments.

The terminology used herein is for the purpose of describing particular embodiments only and is not intended to be limiting of exemplary embodiments. As used herein, the singular forms are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

For high-integration of a semiconductor device, gate line widths of transistors and a distance between the transistors, that is, a design rule, may be decreased. Accordingly, a distance between adjacent gates is gradually decreased. For example, when a plurality of gates are arranged, a potential difference between a channel region and a drain region in a memory cell transistor may be changed due to electric charges stored in electric charge storage layers of adjacent gates, which may increase an energy barrier between a source region and the drain region. Here, the adjacent gates may include gates on the same word line, and gates on neighboring word lines, and may also include gates that are adjacent to each other in a diagonal direction. Such an increase of the energy barrier causes an expected change of a threshold voltage of the memory cell transistor and may deteriorate reliability of a memory device having the memory cell transistor.

Figure 1:
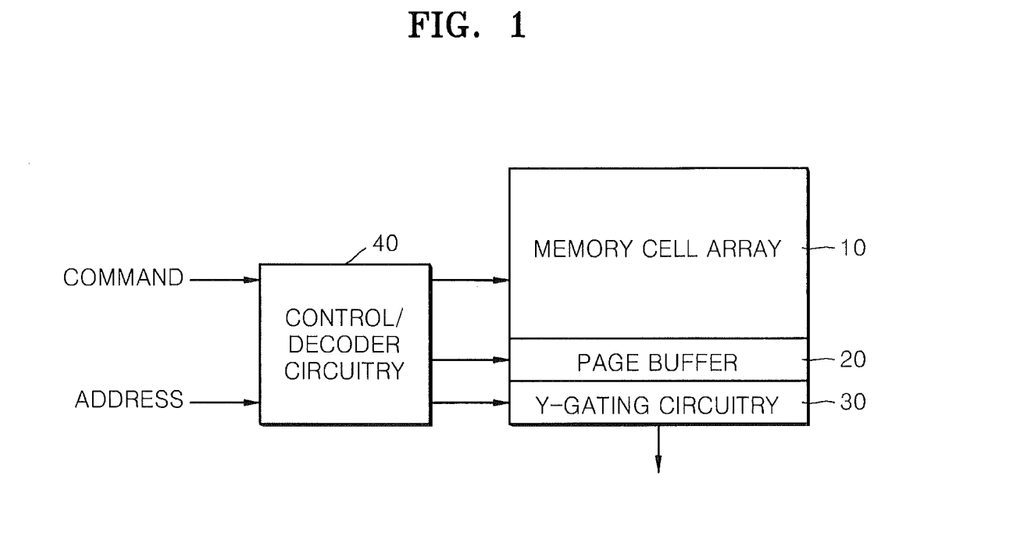
FIG. 1 is a block diagram of a non-volatile memory according to an embodiment of the inventive concept.

FIG. 1 is a block diagram of a non-volatile memory according to an embodiment of the inventive concept. Referring to FIG. 1, the non-volatile memory may include a memory cell array 10, a page buffer 20, a Y-gating circuitry 30, and a control/decoder circuitry 40. The memory cell array 10 may include a plurality of memory blocks, wherein each of the plurality of memory blocks may include a plurality of non-volatile memory cells. The plurality of non-volatile memory cells may be flash memory cells, and moreover, NAND flash memory cells or NOR flash memory cells. The page buffer 20 may temporarily store data to be recorded to the memory cell array 10 or data read from the memory cell array 10. The Y-gating circuitry 30 may transmit data stored in the page buffer 20. The control/decoder circuitry 40 may receive commands and addresses from outside the non-voltage memory, output a control signal for recording data to or reading data from the memory cell array 10, and decode the addresses. The control/decoder circuitry 40 may output a control signal for inputting and outputting data to the page buffer 20 and provide address information to the Y-gating circuitry 30.

Figure 2:
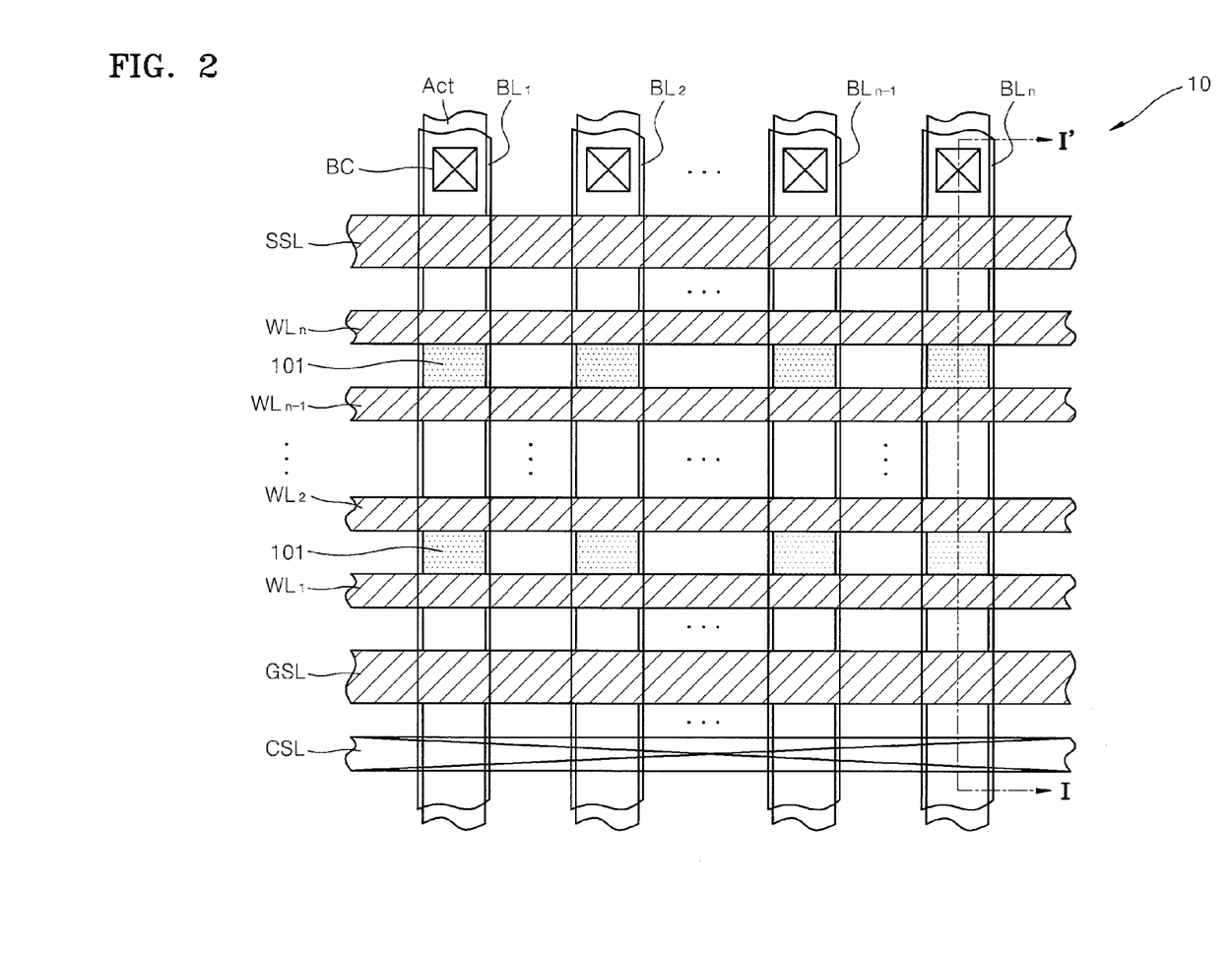
FIG. 2 is a layout view illustrating a part of a memory cell array of the non-volatile memory of FIG. 1 according to an embodiment of the inventive concept.
Figure 3:
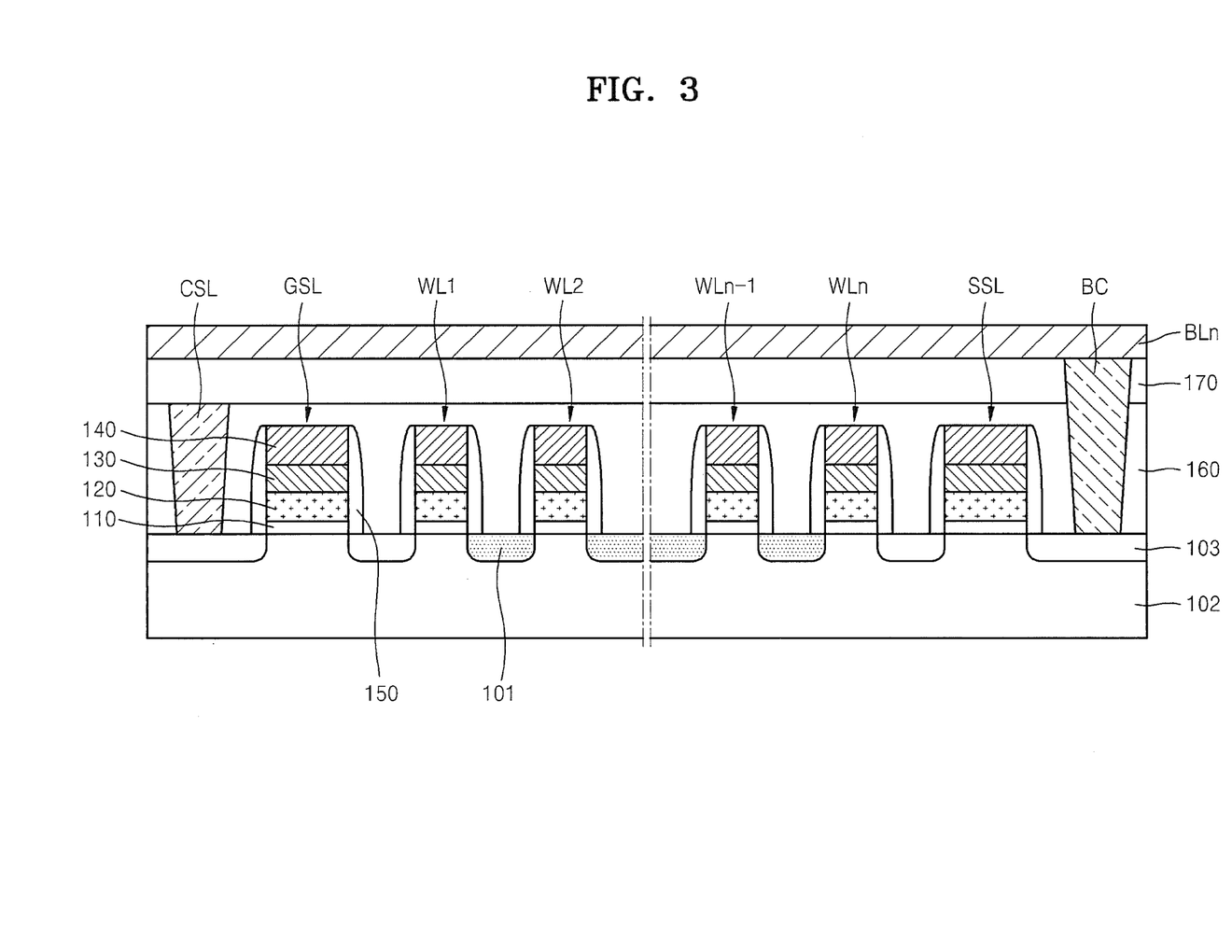
FIG. 3 is a cross-sectional diagram of a non-volatile memory cell string cut along a line I-I' of FIG. 2.

FIG. 2 is a layout view illustrating a part of the memory cell array 10 of the non-volatile memory of FIG. 1 according to an embodiment of the inventive concept. FIG. 3 is a cross-sectional diagram of a non-volatile memory cell string cut along a line I-I' of FIG. 2. Referring to FIGS. 2 and 3, the memory cell array 10 may include a plurality of active regions Act defined by device separation regions formed in a semiconductor layer. The semiconductor layer may include a first region 101 and a second region 102 having a band gap energy different from that of the first region 101. A string selection line SSL and a ground selection line GSL that cross over the active regions Act may be disposed on the active regions Act.

A plurality of word lines WL1, WL2, . . . , WLn−1, and WLn that cross over the active regions Act may be interposed between the string selection line SSL and the ground selection line GSL. The string selection line SSL, the ground selection line GSL, and the word lines WL1, WL2, . . . , WLn−1, and WLn may be parallel to each other. The first region 101 of the semiconductor layer may include the active regions Act between the word lines WL1, WL2, . . . , WLn−1, and WLn and may be expand parallel to the word lines WL1, WL2, . . . , WLn−1, and WLn. Impurity regions 103 may be respectively formed in the active regions Act that are adjacent to sides of the string selection line SSL and the ground selection line GSL. The impurity regions 103 may be formed by injecting impurities into the first region 101 and the second region 102 of the semiconductor layer while forming the first region 101 and the second region 102 or by injecting ions in a subsequent process. Accordingly, a string selection transistor, cell transistors, and a ground selection transistor that are arranged in series are formed. The string selection transistor, the ground selection transistor, and the cell transistors interposed therebetween may constitute each unit memory block. The active regions Act adjacent to the string selection line SSL and opposite to the ground selection line GSL may be defined as drain regions of each string selection transistor. Also, the active regions Act adjacent to the ground selection line GSL and opposite to the string selection line SSL may be defined as source regions of each ground selection transistor.

The word lines WL1, WL2, . . . , WLn−1, and WLn may each include a tunneling insulating layer 110, a charge storage layer 120, an interlayer insulating layer 130, and a gate electrode layer 140 sequentially stacked on the second region 102 of the semiconductor layer. Although not illustrated, the word lines WL1, WL2, . . . , WLn−1, and WLn may each include a barrier conductive layer and/or a word line conductive layer formed on the gate electrode layer 140.

The tunneling insulating layer 110 may be a single layer or a multi-layer including at least one selected from the group consisting of a silicon oxide $SiO_2$, a silicon nitride $Si_3N_4$, a silicon oxynitride SiON, a hafnium oxide $HfO_2$, a hafnium silicon oxide $HfSi_xO_y$, an aluminum oxide $Al_2O_3$, and a zirconium oxide $ZrO_2$.

The charge storage layer 120 may be a charge trap layer or a floating gate conductive film. When the charge storage layer 120 is a floating gate conductive film, the charge storage layer 120 may be formed by depositing polysilicon using chemical vapor deposition (CVD), for example, low pressure chemical vapor deposition (LPCVD) using $SiH_4$ gas, or $Si_2H_6$ and $PH_3$ gas. When the charge storage layer 120 is a charge trap layer, the charge trap layer may be a single layer or a multi-layer including at least one selected from the group consisting of a silicon oxide $SiO_2$, a silicon nitride $Si_3N_4$, a silicon oxynitride SiON, a hafnium oxide $HfO_2$, a zirconium oxide $ZrO_2$, a tantalum oxide $Ta_2O_3$, a titanium oxide $TiO_2$, a hafnium aluminum oxide $HfAl_xO_y$, a hafnium tantalum oxide $HfTa_xO_y$, a hafnium silicon oxide $HfSi_xO_y$, and an aluminum gallium nitride $AlGa_xN_y$.

Also, the interlayer insulating layer 130 may be a single layer including at least one selected from the group consisting of a silicon oxide $SiO_2$, a silicon nitride $Si_3N_4$, a silicon oxynitride SiON, and a high-k dielectric material layer, or a multi-layer in which a plurality of layers including at least one of the materials listed above are stacked. The high-k dielectric material layer may include at least one selected from the group consisting of an aluminum oxide $Al_2O_3$, a tantalum oxide $Ta_2O_3$, a titanium oxide $TiO_2$, a yttrium oxide $Y_2O_3$, a zirconium oxide $ZrO_2$, a zirconium silicon oxide $ZrSi_xO_y$, a hafnium oxide $HfO_2$, a hafnium silicon oxide $HfSi_xO_y$, a lanthanum oxide $La_2O_3$, a lanthanum aluminum oxide $LaAl_xO_y$, a lanthanum hafnium oxide $LaHf_xO_y$, a hafnium aluminum oxide $HfAl_xO_y$, and a praseodymium oxide $Pr_2O_3$.

The gate electrode layer 140 may be a single layer or a multi-layer including at least one selected from the group consisting of polysilicon, aluminum Al, gold Au, beryllium Be, bismuth Bi, cobalt Co, hafnium Hf, indium In, manganese Mn, molybdenum Mo, nickel Ni, lead Pb, palladium Pd, platinum Pt, rhodium Rh, rhenium Re, ruthenium Ru, tantalum Ta, tellium Te, titanium Ti, tungsten W, zinc Zn, zirconium Zr, nitrides thereof, and silicides thereof.

However, the tunneling insulating layer 110, the charge storage layer 120, the interlayer insulating layer 130, and the gate electrode layer 140 are only examples and the inventive concept is not limited thereto.

Spacers 150 may be disposed on side walls of the tunneling insulating layer 110, the charge storage layer 120, the interlayer insulating layer 130, and the gate electrode layer 140. The spacers 150 may each be a multi-layer.

As described above, the string selection line SSL and the ground selection line GSL may have the same stacked structure as the word lines WL1, WL2, . . . , WLn-1, and WLn. In general, widths of the string selection line SSL and the ground selection line GSL may be greater than widths of the word lines WL1, WL2, . . . , WLn-1, and WLn. However, the inventive concept is not limited thereto.

A first interlayer insulating film 160 is provided to cover the word lines WL1, WL2, . . . , WLn-1, and WLn, the string selection line SSL, and the ground selection line GSL. A common source line CSL that penetrates the first interlayer insulating film 160 and connects the source regions of the ground selection transistors are provided. The common source line CSL may be parallel to the ground selection line GSL. A second interlayer insulating film 170 may be disposed on the first interlayer insulating film 160. Bit line plugs BCs that penetrate the second interlayer insulating film 170 and the first interlayer insulating film 160 and connect the drain regions of the string selection transistors may be provided. Bit lines BL1, BL2, . . . , BLn-1, and BLn that connect the bit line plugs BC and cross above the word lines WL1, WL2, . . . , WLn-1, and WLn may be disposed on the second interlayer insulating film 170. The bit lines BL1, BL2, . . . , BLn-1, and BLn may be parallel to the active regions Act.

The first region 101 of the semiconductor layer may include materials having a smaller band gap energy than that of the second region 102 of the semiconductor layer. The first region 101 of the semiconductor layer may include the active regions Act between the word lines WL1, WL2, . . . , WLn-1, and WLn. In consideration of a performance of the selection transistors, the active regions Act between adjacent string selection lines SSLs, between adjacent ground selection lines GSLs, between the string selection line SSL and the word line WLn, and between the ground selection line GSL and the word line WL1 may be formed as the second regions 102 of the semiconductor layer. Instead, the active regions Act between the adjacent string selection lines SSLs and between the adjacent ground selection lines GSLs may be formed as the second regions 102 of the semiconductor layer and the active regions Act between the string selection line SSL and the word line WLn and between the ground selection line GSL and the word line WL1 may be formed as the first region 101 of the semiconductor layer. The first region 101 of the semiconductor layer may include silicon germanium SiGe or germanium Ge, and the second region 102 of the semiconductor layer may include silicon Si. The impurity regions 103 may be formed in the first region 101 of the semiconductor layer in the active regions Act between the word lines WL1, WL2, . . . , WLn-1, and WLn. Here, the impurity regions 103 may not match with boundaries of the first region 101 of the semiconductor layer. The second region 102 of the semiconductor layer may include the impurity regions 103 adjacent to both sides of the string selection line SSL and ground selection line GSL. The types of impurities may be the same in the first region 101 and the second region 102 and may be, for example, p-type impurities.

Figure 4A:
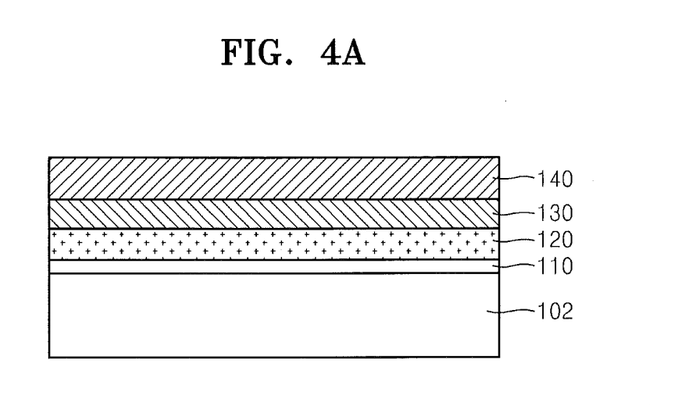
FIGS. 4A through 4C are cross-sectional diagrams illustrating a method of manufacturing a memory device of the non-volatile memory of FIG. 3 according to an embodiment of the inventive concept.
Figure 4B:
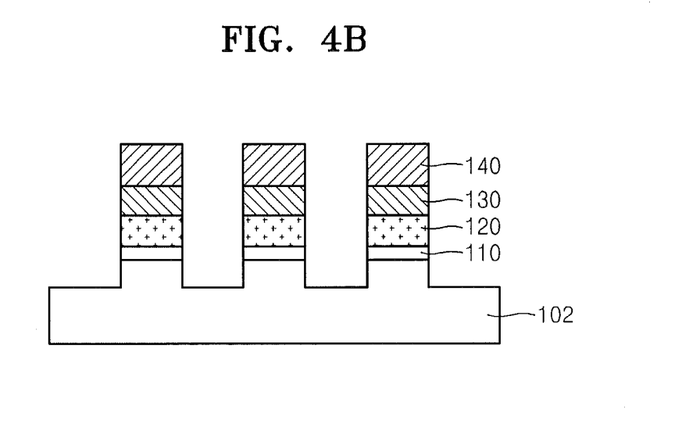
Figure 4C:
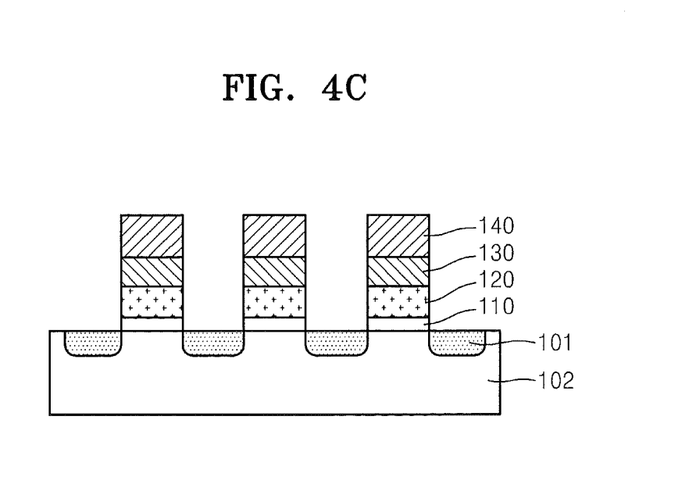

FIGS. 4A through 4C are cross-sectional diagrams illustrating a method of manufacturing a memory device of the non-volatile memory of FIG. 3 according to an embodiment of the inventive concept. Referring to FIG. 4A, a gate structure of the cell transistors is formed on the second region 102 of the semiconductor layer. The gate structure may be formed by sequentially stacking the tunneling insulating layer 110, the charge storage layer 120, the interlayer insulating layer 130, and the gate electrode layer 140.

Referring to FIG. 4B, a mask pattern (not illustrated) is formed on the gate structure and the gate structure is etched to form word lines. Although not illustrated in the drawings, widths of the mask pattern in regions where selection lines are formed may be greater than widths of the mask pattern in regions where the word lines are formed. When etching, the second region 102 of the semiconductor layer may be over etched. The degree of recess of the second region 102 of the semiconductor layer by the over etching is not limited to the recess illustrated in the drawings. Although not illustrated, a process of recessing the second region 102 of the semiconductor layer may be performed after forming side wall protection films on side walls of the gate structure that results the spacers 150 in FIG. 3.

Referring to FIG. 4C, a semiconductor material having a smaller band gap energy than that of the second region 102 of the semiconductor layer is grown on the second region 102 of the semiconductor layer exposed between sides of the gate structure to form the first region 101 of the semiconductor layer. A method of growing the semiconductor material may include selective epitaxial growth (SEG). A height of upper surfaces of the first region 101 of the semiconductor layer is not limited to the height illustrated in the drawings. A source or drain (hereinafter, referred to as source/drain) regions may be formed by injecting impurities into the first region 101 of the semiconductor layer while forming the first region 101 of the semiconductor layer or by injecting impurity ions after forming the first region 101 of the semiconductor layer.

FIGS. 5A through 7 are cross-sectional diagrams of non-volatile memory cell strings according to other embodiments of the inventive concept. The non-volatile memory cell strings of FIGS. 5A through 7 are modifications of the non-volatile memory cell string of FIG. 3 and thus any overlapped description will be omitted. In each structure, a thickness of the tunneling insulating layer 110, types and concentration of impurities doped into channels, a thickness of the spacers 150, and materials of the semiconductor layer may be selected to realize appropriate device performance.

Figure 5A:
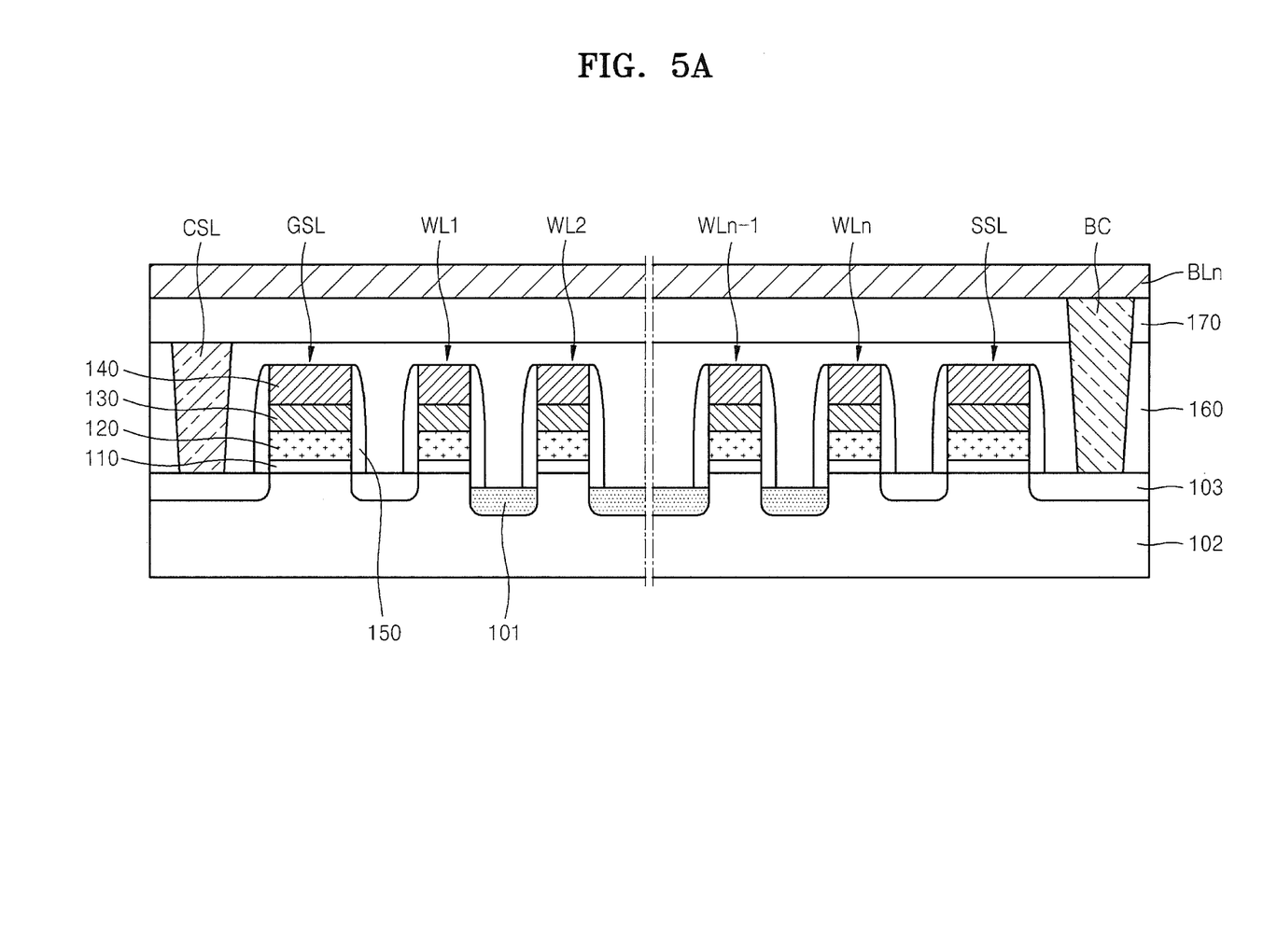
Figure 5B:
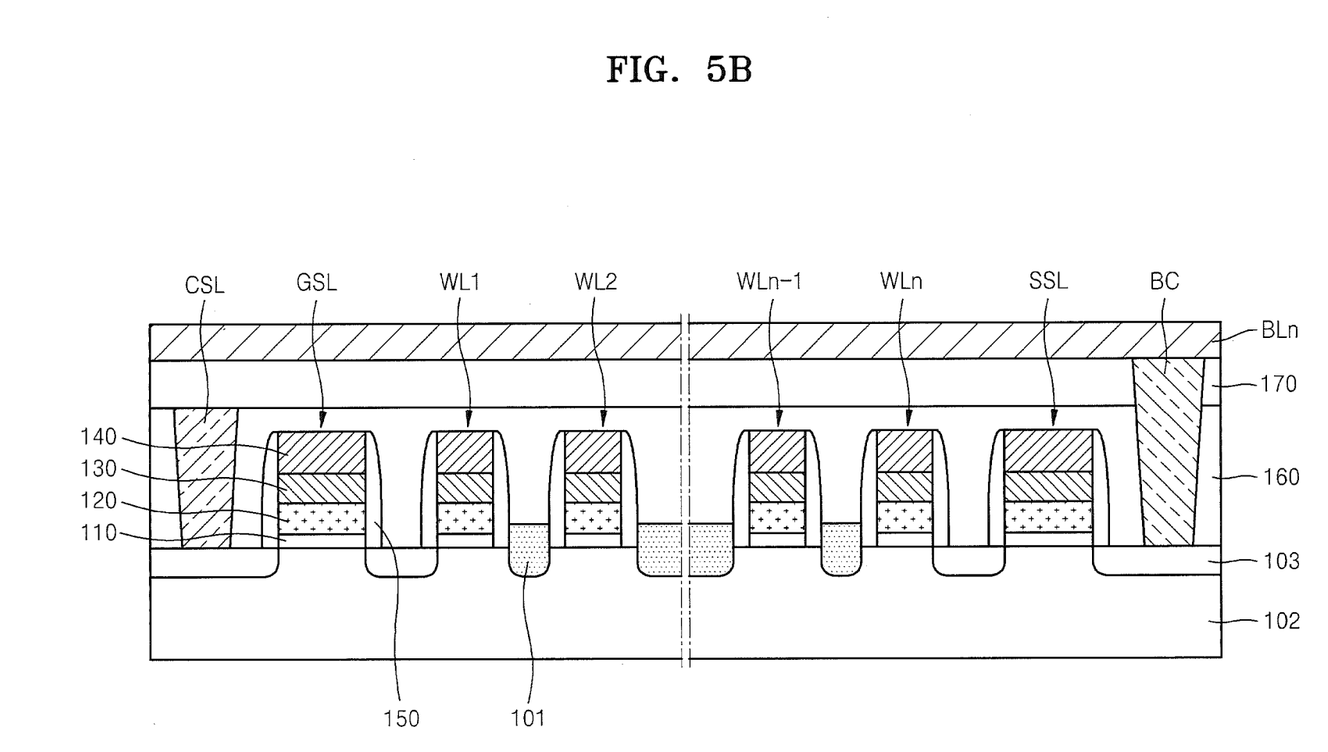

Referring to FIG. 5A, the upper surfaces of the first region 101 of the semiconductor layer are disposed below an upper surface of the second region 102. Referring to FIG. 5B, the upper surfaces of the first region 101 of the semiconductor layer are disposed above the upper surface of the second region 102. Such structures of FIGS. 5A and 5B may be realized by the degree of recess of the second region 102 of the semiconductor layer and controlling heights of the first region 101 of the semiconductor layer.

Figure 6A:
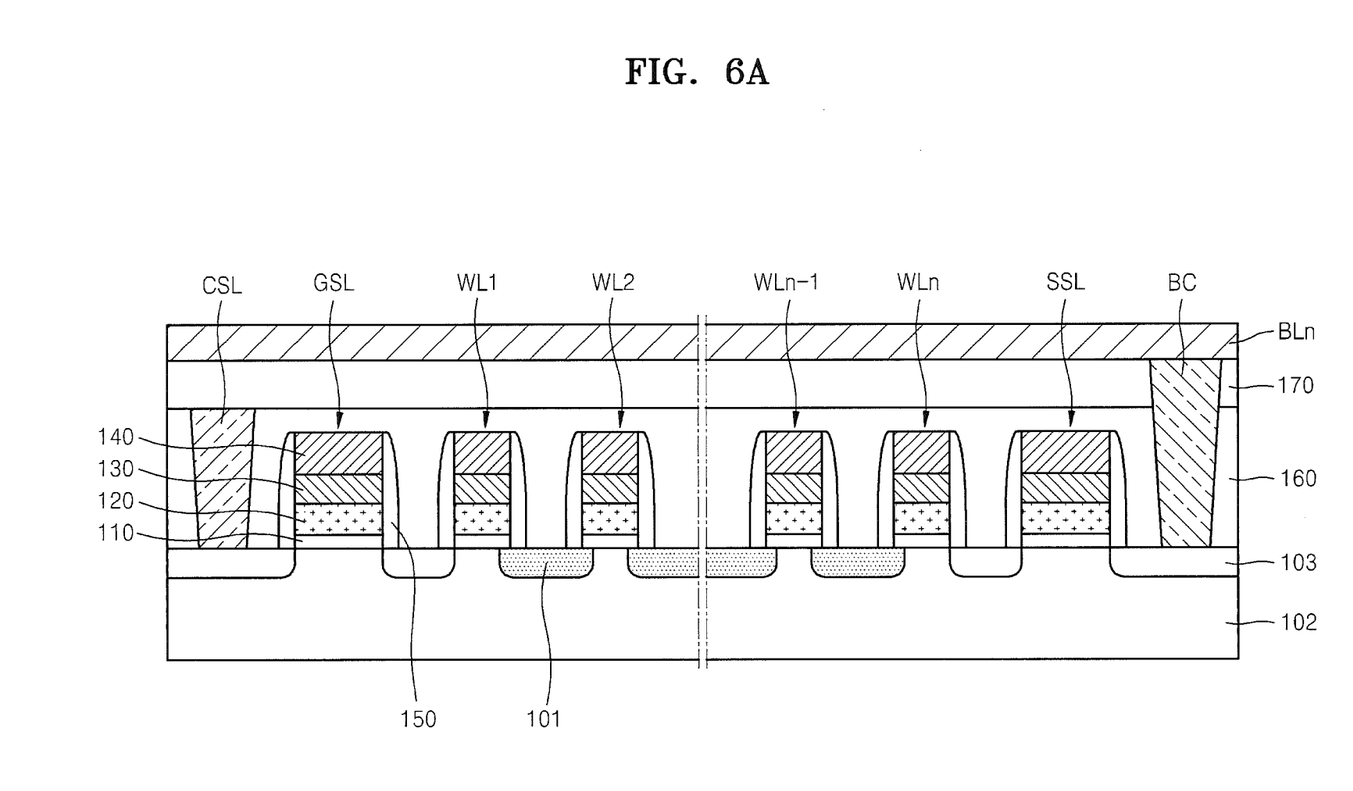
Figure 6B:
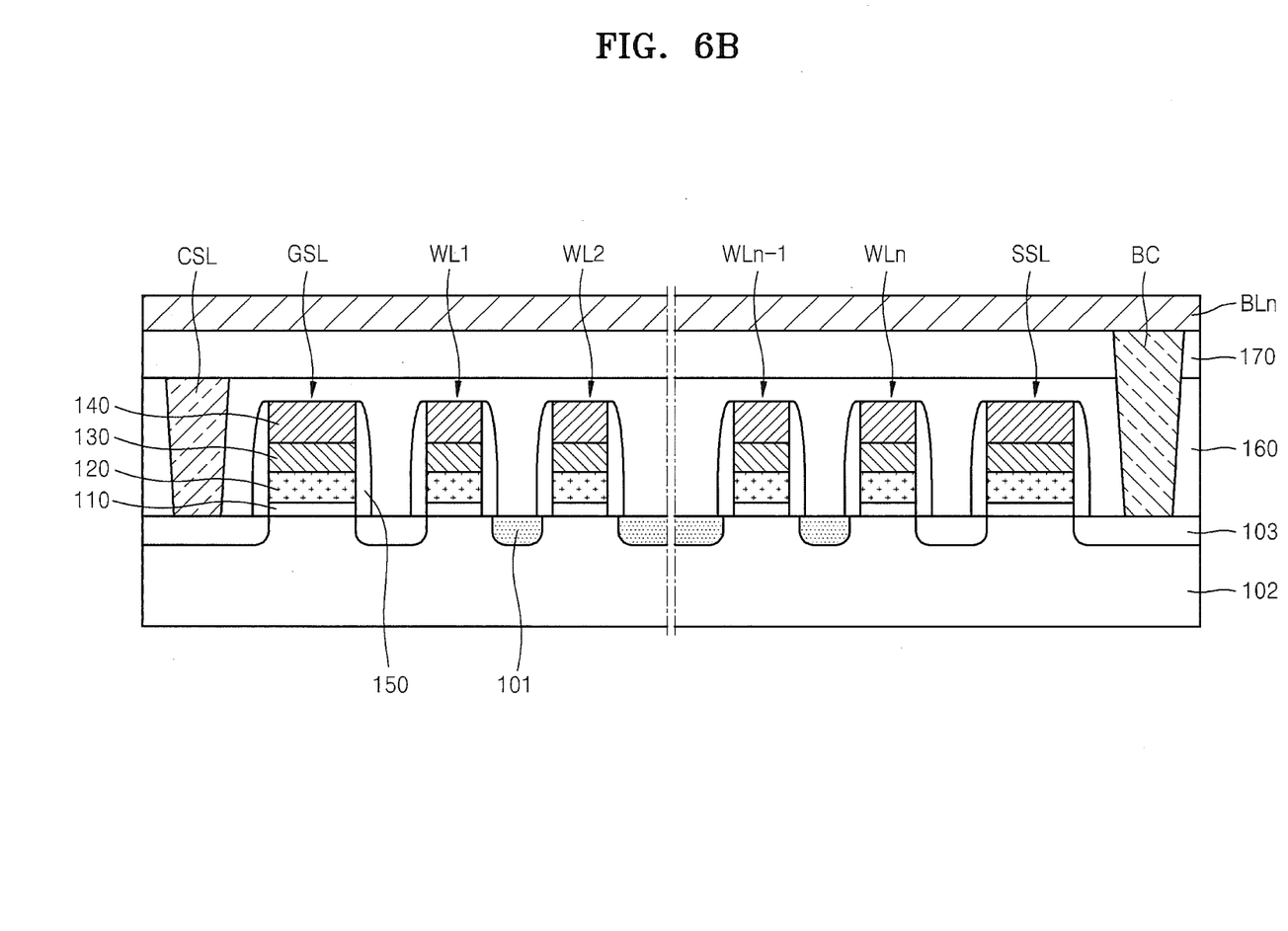

Referring to FIG. 6A, the first region 101 of the semiconductor layer expands in a bit line BLn direction and thus include channel regions below the gate structure of the cell transistors. Such a structure of FIG. 6A may be realized by selecting wet etching as a method of recessing the second region 102 of the semiconductor layer. Referring to FIG. 6B, the first region 101 of the semiconductor layer may have a structure that is spaced apart from the sides of the gate structure by a predetermined distance and reduced in a bit line BLn direction. Such a structure of FIG. 6B may be realized by controlling a thickness of the side wall protection films when the side wall protection films are formed on the side walls of the memory gate structure and then the second region 102 of the semiconductor layer is recessed. Each structure of FIGS. 6A and 6B may be used to control threshold voltage of the cell transistors.

Figure 7:
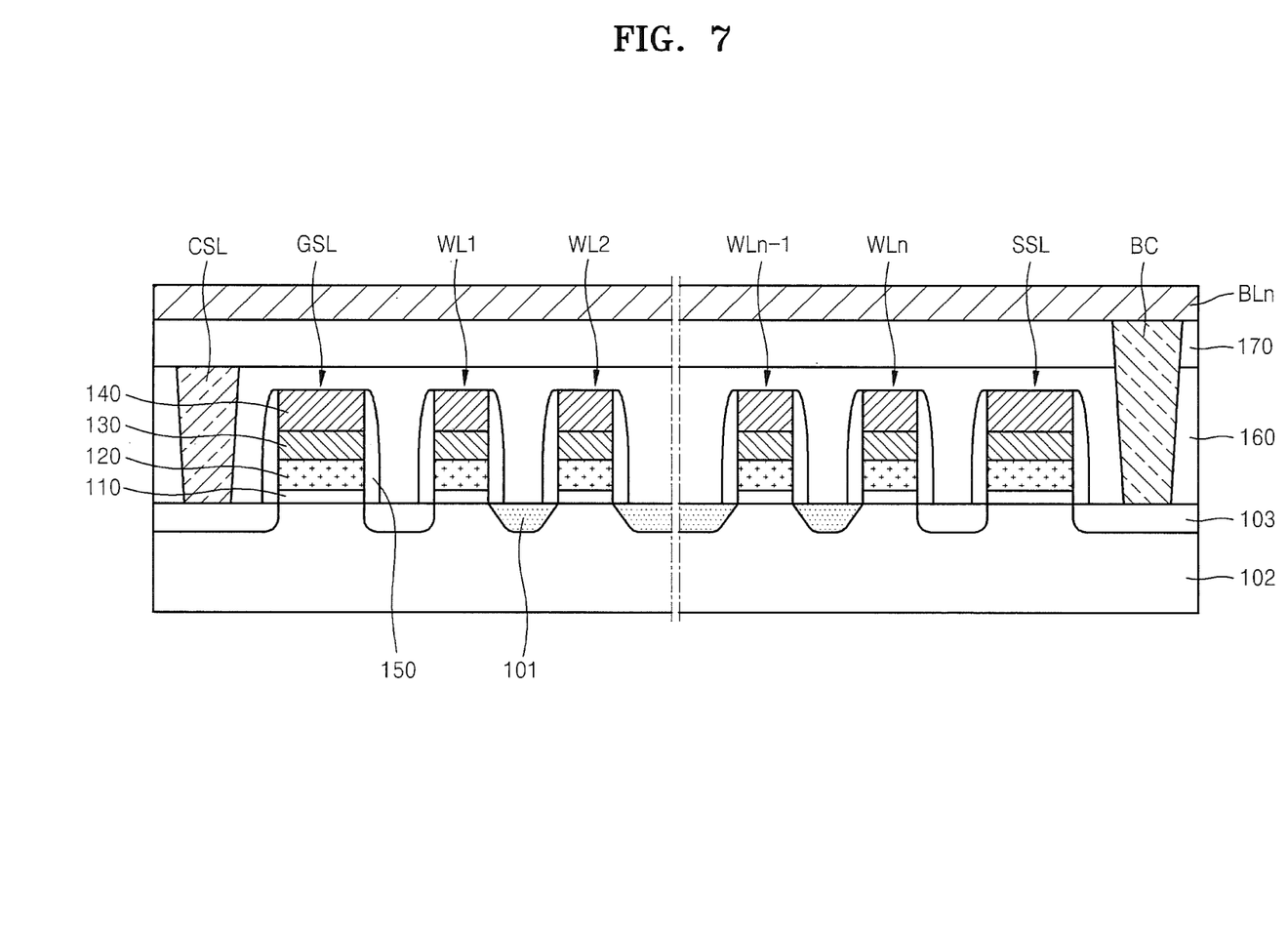

Referring to FIG. 7, the upper surfaces of the first region 101 of the semiconductor layer is wider than the lower surfaces of the first regions 101 of the semiconductor layer. Such a structure of FIG. 7 may be formed by controlling, for example, isotropy in the etching process for forming the word lines. The structures of the current embodiments may be used, for example, for forming an electric field profile for reducing short channel effect.

Figure 8:
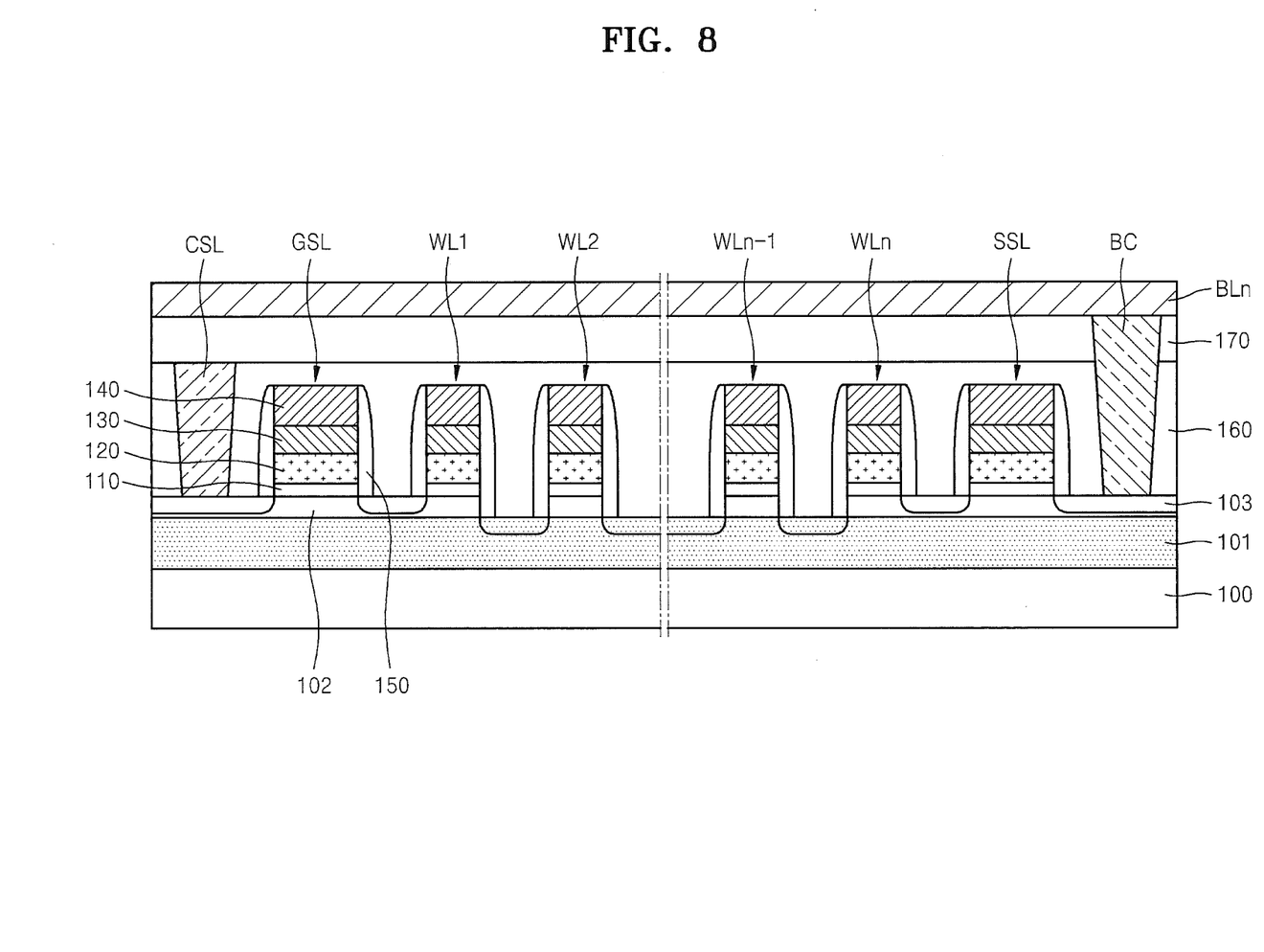
FIG. 8 is a cross-sectional diagram of a non-volatile memory cell string according to another embodiment of the inventive concept.

FIG. 8 is a cross-sectional diagram of a non-volatile memory cell string according to another embodiment of the inventive concept. Referring to FIG. 8, the first region 101 of the semiconductor layer is disposed on a substrate 100 along a bit line BLn direction and the second region 102 are partially formed in the channel regions of the cell transistors and the selection transistors on the first region 101 of the semiconductor layer. The substrate 100 may be formed of a semiconductor material. Regions between the cell transistors are formed by exposing the first region 101 of the semiconductor layer. The regions between adjacent string selection lines SSLs, between adjacent ground selection lines GSLs, between the string selection line SSL and the word line WLn, and between the ground selection line GSL and the word line WL1 may be formed as the second regions 102 of the semiconductor layer without exposing the first region 101 of the semiconductor layer. A gate structure of a word line may be formed in the same structure as the previous embodiment and the first region 101 of the semiconductor layer may include a material having a smaller band gap energy than that of the second regions 102. The first region 101 of the semiconductor layer may include silicon germanium SiGe or germanium Ge, and the second regions 102 of the semiconductor layer may include silicon Si.

Figure 9A:
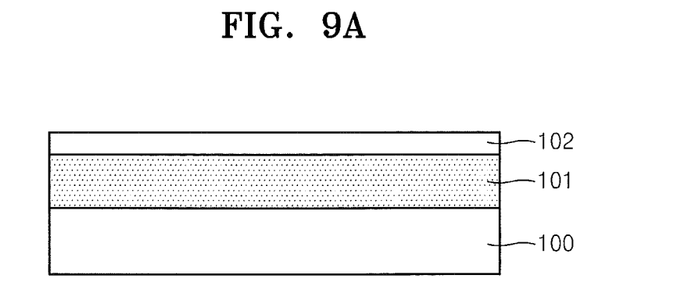
FIGS. 9A through 9C are cross-sectional diagrams illustrating a method of manufacturing a nonvolatile memory device according to another embodiment of the inventive concept.
Figure 9B:
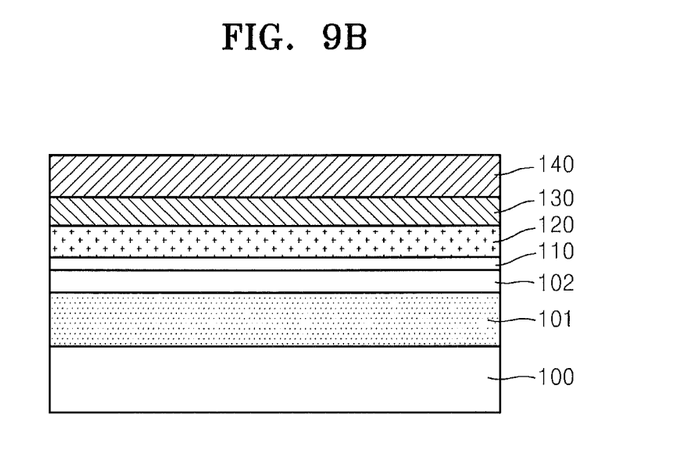
Figure 9C:
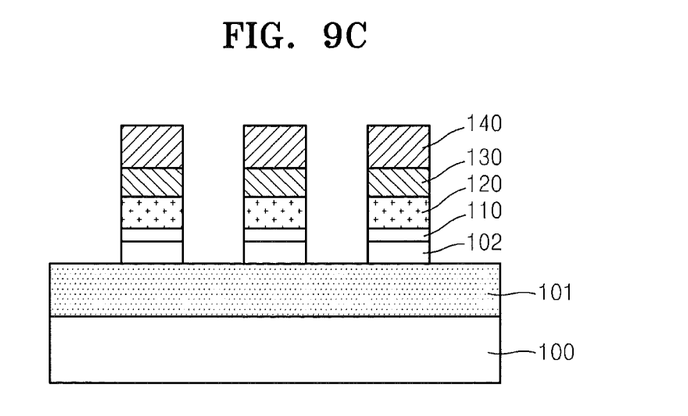

FIGS. 9A through 9C are cross-sectional diagrams illustrating a method of manufacturing a nonvolatile memory device according to another embodiment of the inventive concept. Referring to FIG. 9A, the first region 101 of the semiconductor layer is formed on the substrate 100 and the second region 102 of the semiconductor layer is formed on the first region 101. The substrate 100 may be formed of a semiconductor material. The first region 101 and second region 102 of the semiconductor layer may be grown by using CVD or epitaxial growth including molecular beam epitaxy (MBE). Referring to FIG. 9B, a gate structure is formed on the second region 102 of the semiconductor layer. The gate structure may be formed by sequentially stacking the tunneling insulating layer 110, the charge storage layer 120, the interlayer insulating layer 130, and the gate electrode layer 140. Referring to FIG. 9C, a mask pattern (not illustrated) is formed on the gate structure and the gate structure is etched to form word lines. During etching of the gate structure, the second region 102 of the semiconductor layer is also etched so that the first region 101 of the semiconductor layer is exposed between sides of the gate structure. Then, the source/drain regions may be formed by injecting impurity ions.

Figure 10A:
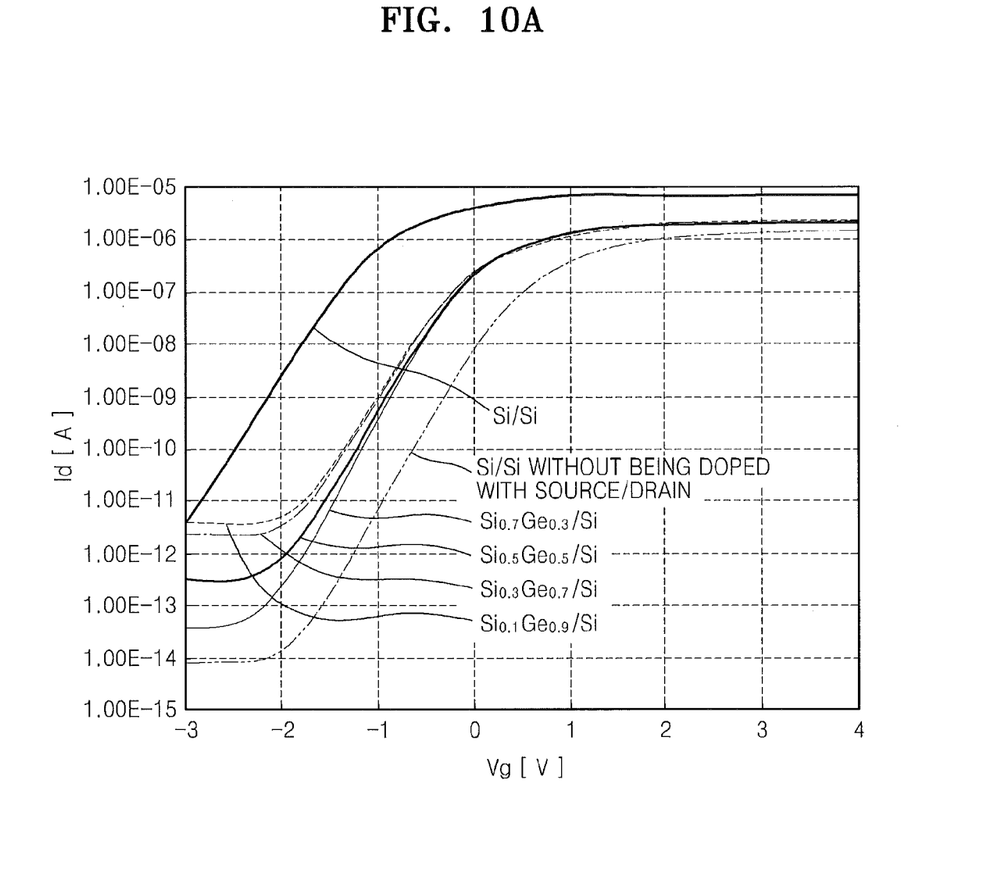
FIG. 10A is a graph illustrating a simulation result of the relationship between a gate electrode voltage and a drain current in non-volatile memory cell transistors according to embodiments of the inventive concept and FIG. 10B is a graph illustrating a simulation result of a threshold voltage of non-volatile memory cell transistors according to embodiments of the inventive concept.
Figure 10B:
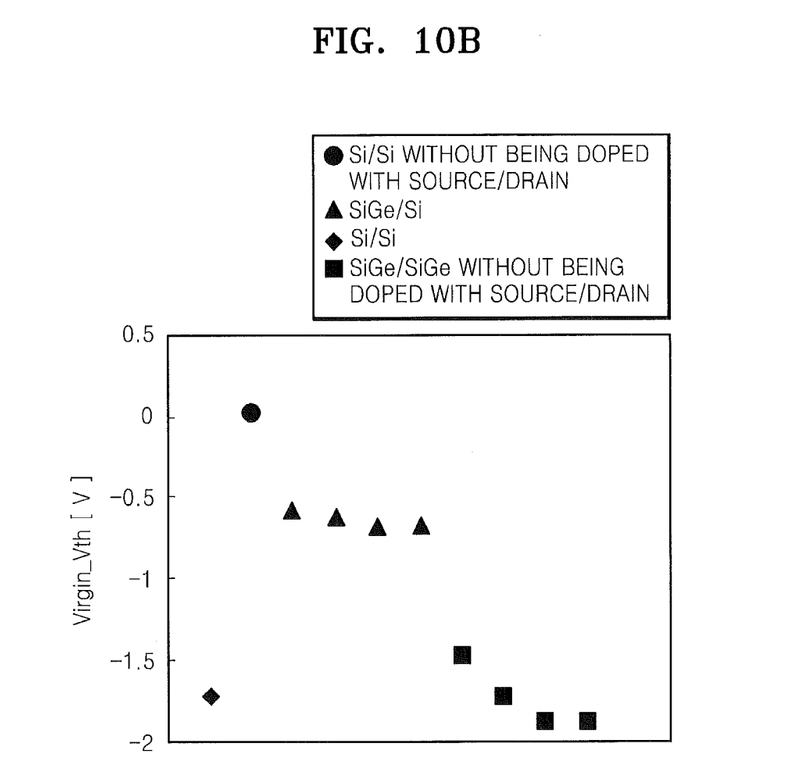

FIGS. 10A and 10B are graphs respectively illustrating simulation results of the relationship between a gate electrode voltage Vg and a drain current Id in the non-volatile memory cell transistors of FIG. 3 and a threshold voltage Virgin_Vth of the non-volatile memory cell transistor of FIG. 3 according to embodiments of the inventive concept.

Referring to FIGS. 10A and 10B, materials of the first region 101 and second region 102 of the semiconductor layer are described in the graph as 'first region 101/second region 102'. In the simulation, the concentration of the impurities in the channel region is constant, for example, boron B at a concentration of $8E17/cm^3$. When both first region 101 and second region 102 of the semiconductor layer are formed of silicon Si and arsenic As at a concentration of $2E18/cm^3$ is injected into the source/drain of the memory cell transistors (Si/Si), threshold voltages Virgin_Vth are low. Such a condition is applied to a general memory device and impurities may not be injected to the source/drain in order to reduce short channel effect due to a reduction of a design rule. When both first region 101 and second region 102 of the semiconductor layer are formed of silicon Si and impurities are not injected into the source/drain of the memory cell transistor (S1/Si without being doped with the source/drain), threshold voltages Virgin_Vth of the transistors are increased. A threshold voltage of the transistor (SiGe/Si), in which the first region 101 of the semiconductor layer is formed of silicon germanium SiGe, the second region 102 is formed of silicon Si, and boron B at a concentration of $8E17/cm^3$ is injected into the source/drain, is lower than that of Si/Si without being doped with the source/drain. In the nonvolatile memory device according to the inventive concept, band gap energy of silicon germanium SiGe is lower than that of silicon Si and p-type impurities are injected into the first region 101 and second region 102 of the semiconductor layer. Thus, the nonvolatile memory device may not be less affected by an electric field of the adjacent cell transistors and thus an energy barrier between the source/drain of the transistors is lowered. The band gap energy of silicon Si is about 1.1 eV and the band gap energy of germanium Ge is about 0.67 eV. The band gap energy of silicon germanium SiGe varies according to proportion of germanium Ge. A higher threshold voltage is shown in SiGe/Si than that of when both first region 101 and second region 102 of the semiconductor layer are formed of silicon germanium SiGe and impurities are not injected into the source/drain (SiGe/SiGe without being doped with the source/drain). In silicon germanium SiGe, proportion of germanium Ge and types and concentration of impurities in the semiconductor layer may affect the performance of the memory cell transistors.

Figure 11:
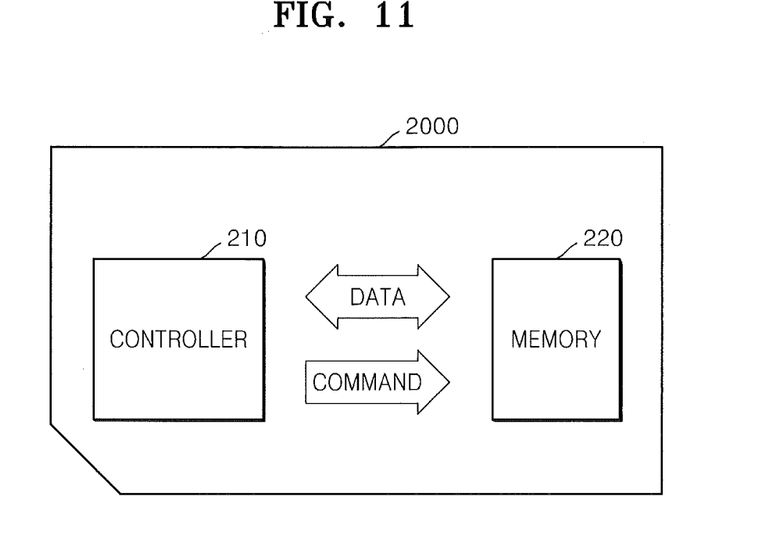
FIG. 11 is a block diagram schematically illustrating a memory card according to an embodiment of the inventive concept.

The nonvolatile memory devices of the embodiments of the inventive concept are not limited to flash memory devices and multi-bit flash memory devices having relatively small range of allowable threshold voltages may be included in the scope of the inventive concept. FIG. 11 is a block diagram schematically illustrating a memory card 2000 according to an embodiment of the inventive concept. Referring to FIG. 11, a controller 210 and a memory 220 may be disposed to exchange an electric signal with each other. For example, when a command is given from the controller 210, the memory 220 may transmit data to the controller 210. The memory 220 may include any one of the nonvolatile memory devices according to the embodiments of the inventive concept. As well known in the art, the nonvolatile memory device according to the embodiments of the inventive concept may be arranged in a "NAND" and "NOR" architecture memory array (not illustrated) in correspondence to a corresponding logic gate design. A memory array arranged in a plurality of lines and columns may constitute at least one memory array bank (not illustrated). The memory 220 may include the memory array (not illustrated) or the memory array bank (not illustrated). Also, the memory card 2000 may further include a general line decoder (not illustrated), a column decoder (not illustrated), I/O buffers (not illustrated), and/or control registers (not illustrated) in order to drive the memory array banks (not illustrated). The memory card 2000 may be used in memory devices, for example, memory stick cards, smart media (SM) cards, secure digital (SD) cards, mini SD cards, or multi media cards (MMC).

Figure 12:
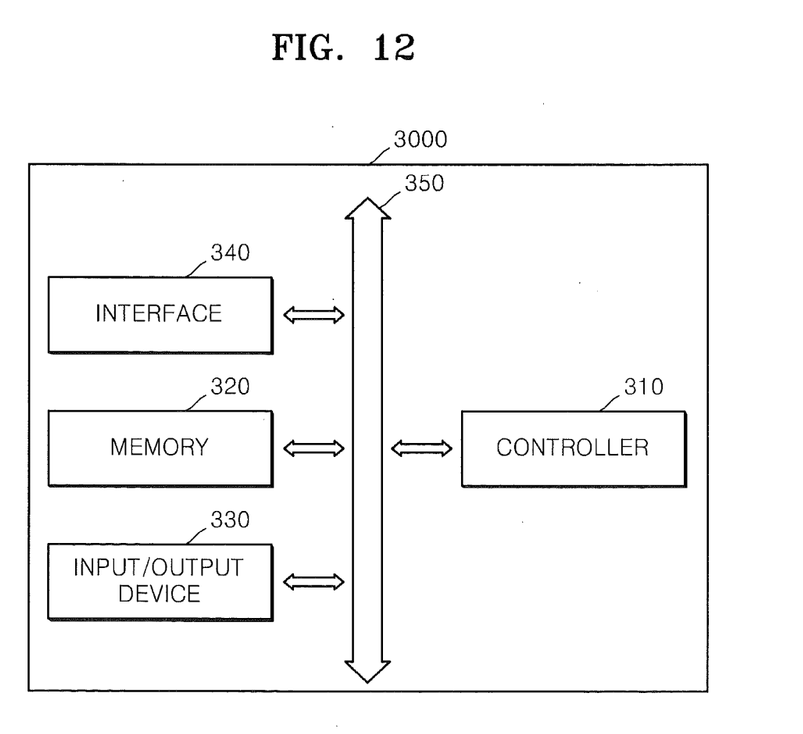
FIG. 12 is a block diagram schematically illustrating a system according to an embodiment of the inventive concept.

FIG. 12 is a block diagram schematically illustrating a system 3000 according to an embodiment of the inventive concept. Referring to FIG. 12, the system 3000 may include a controller 310, an input/output device 330, a memory 320, and an interface 340. The system 3000 may be a mobile system or a system for transmitting or receiving information. The mobile system may include PDAs, portable computers, web tablets, wireless phones, mobile phones, digital music players, or memory cards. The controller 310 may execute programs or control the system 3000. The controller 310 may be, for example, a microprocessor, a digital signal processor, a microcontroller, or a device similar to the above examples. The input/output device 330 may be used to input or output data of the system 3000. The system 3000 may be connected to an external device, for example, a personal computer or a network, by using the input/output device 330 and exchanges data with the external device. The input/output device 330 may be, for example, a keypad, a keyboard, or a display device. The memory 320 may store code and/or data for driving the controller 310 and/or store data processed in the controller 310. The memory 320 may include any one of the non-volatile memory according to the embodiments of the inventive concept. The interface 340 may be a data transmission path between the system 3000 and an external device. The controller 310, the input/output device 330, the memory 320, and the interface 340 may be communicated with each other through a bus 350. For example, the system 3000 may be used in mobile phones, MP3 players, navigations, portable multimedia players (PMPs), solid state disks (SSDs), or household appliances.

While the inventive concept has been particularly shown and described with reference to exemplary embodiments thereof, it will be understood that various changes in form and details may be made therein without departing from the spirit and scope of the following claims.

What is claimed is:

1. A nonvolatile memory device, comprising:
a plurality of nonvolatile memory cell transistors having respective channel regions within a semiconductor layer comprising a first semiconductor material and respective source/drain regions that consist essentially of a second semiconductor material having a smaller bandgap relative to the first semiconductor material and form heterogeneous junctions with corresponding ones of the channel regions; and
a string selection transistor having a respective channel region within the semiconductor layer;
wherein the source/drain regions form non-rectifying junctions with the channel regions; wherein the semiconductor layer is a P-type silicon layer; wherein the source/drain regions of the plurality of nonvolatile memory cell transistors are P-type germanium or P-type silicon germanium; and wherein a first source/drain region of the string selection transistor comprises N-type silicon.

2. A nonvolatile memory device, comprising:
a string of nonvolatile memory cell transistors, said string comprising a plurality of nonvolatile memory cell transistors having respective channel regions within a semiconductor layer and respective source/drain regions that consist essentially of germanium and form heterogeneous junctions with corresponding ones of the channel regions, and a nonvolatile memory cell transistor comprising a first germanium or silicon germanium source/drain region and a second silicon-only source/drain region; and
wherein the semiconductor layer comprises a first semiconductor material having a larger bandgap than germanium.

3. The memory device of claim 2, wherein the first germanium or silicon germanium source/drain region is P-type and a second silicon-only source/drain region is N-type.

4. A nonvolatile memory device, comprising:
a substrate having a buried silicon germanium layer therein and a silicon layer on the buried silicon germanium layer; and
a plurality of nonvolatile memory cell transistors having respective channel regions within the silicon layer and respective source/drain regions within the buried silicon germanium layer;
wherein at least one of said plurality of nonvolatile memory cell transistors has a first source/drain region that extends within the buried silicon germanium layer and consists essentially of silicon germanium and a second source/drain region that extends within the silicon layer and consists essentially of silicon.

5. The memory device of claim 4, wherein said plurality of nonvolatile memory cell transistors is arranged as a NAND-type string of nonvolatile memory cell transistors.

6. The memory device of claim 4, wherein the plurality of nonvolatile memory cell transistors comprise charge storage regions on the silicon layer; and wherein the silicon layer extends between the charge storage regions and the buried silicon germanium layer.

* * * * *